(12) United States Patent
Kharas et al.

(10) Patent No.: US 11,340,400 B2
(45) Date of Patent: May 24, 2022

(54) HYBRID INTEGRATION FOR PHOTONIC INTEGRATED CIRCUITS

(71) Applicant: Massachusetts Institute of Technology, Cambridge, MA (US)

(72) Inventors: Boris Kharas, Lexington, MA (US); Reuel B. Swint, Billerica, MA (US); Cheryl Marie Sorace-Agaskar, Bedford, MA (US); Paul William Juodawlkis, Arlington, MA (US); Suraj Deepak Bramhavar, Arlington, MA (US); Jason Plant, Merrimack, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 175 days.

(21) Appl. No.: 16/809,640

(22) Filed: Mar. 5, 2020

(65) Prior Publication Data
US 2020/0284978 A1    Sep. 10, 2020

Related U.S. Application Data

(60) Provisional application No. 62/814,413, filed on Mar. 6, 2019.

(51) Int. Cl.
*H01L 31/0232* (2014.01)
*G02B 6/136* (2006.01)
(Continued)

(52) U.S. Cl.
CPC .......... *G02B 6/136* (2013.01); *H01L 31/0232* (2013.01); *H01L 31/12* (2013.01);
(Continued)

(58) Field of Classification Search
CPC .................... H01L 31/0232; H01L 31/02327
See application file for complete search history.

(56) References Cited

U.S. PATENT DOCUMENTS

| 5,011,794 A † | 4/1991 | Grim |
| 9,316,785 B2 | 4/2016 | Krasulick et al. |

(Continued)

FOREIGN PATENT DOCUMENTS

WO    2016202357 A1    12/2016

OTHER PUBLICATIONS

Alto et al., "Integration of InP-based optoelectronics with silicon waveguides." Integrated Optics: Devices, Materials, and Technologies XIII. vol. 7218. International Society for Optics and Photonics, 2009. 15 pages.

Guan et al., "Widely-tunable, narrow-linewidth III-V/silicon hybrid external-cavity laser for coherent communication." Optics Express 26.7 (2018): 7920-7933.

(Continued)

*Primary Examiner* — Jae Lee
(74) *Attorney, Agent, or Firm* — Smith Baluch LLP

(57) ABSTRACT

Photonic integrated circuits (PICs) enable manipulation of light on a chip for telecommunications and information processing. They can be made with silicon and silicon-compatible materials using complementary metal-oxide-semiconductor (CMOS) fabrication techniques developed for making electronics. Unfortunately, most light sources are made with III-V and II-VI materials, which are not compatible with silicon CMOS fabrication techniques. As a result, the light source for a PIC is either off-chip or integrated onto the PIC after CMOS fabrication is over. Hybrid integration can be improved by forming a recess in the PIC to receive a III-V or II-VI photonic chip. Mechanical stops formed in or next to the recess during fabrication align the photonic chip vertically to the PIC. Fiducials on the PIC and the photonic chip enable sub-micron lateral alignment. As a (Continued)

result, the photonic chip can be flip-chip bonded to the PIC with sub-micron vertical and lateral alignment precision.

20 Claims, 12 Drawing Sheets

(51) Int. Cl.
*H01L 31/12* (2006.01)
*G02B 6/12* (2006.01)
*G02B 6/02* (2006.01)
*G02B 6/42* (2006.01)
*G02B 6/43* (2006.01)

(52) U.S. Cl.
CPC ...... *G02B 6/02033* (2013.01); *G02B 6/12004* (2013.01); *G02B 6/4228* (2013.01); *G02B 6/4232* (2013.01); *G02B 6/43* (2013.01); *G02B 2006/12061* (2013.01)

(56) References Cited

U.S. PATENT DOCUMENTS

| | | | |
|---|---|---|---|
| 9,496,431 | B2 | 11/2016 | Krasulick et al. |
| 9,671,577 | B2 | 6/2017 | Dangel et al. |
| 9,791,642 | B2 | 10/2017 | Dangel et al. |
| 9,817,197 | B2 | 11/2017 | Kinghorn et al. |
| 9,882,073 | B2 | 1/2018 | Krasulick et al. |
| 9,923,105 | B2 | 3/2018 | Krasulick et al. |
| 10,168,497 | B2 | 1/2019 | Merget et al. |
| 10,890,712 | B2 * | 1/2021 | Soitani ............. H01L 29/66462 |
| 2014/0319656 | A1 | 10/2014 | Marchena et al. |
| 2015/0277044 | A1 * | 10/2015 | Hatori .................. G02B 6/1228 385/43 |
| 2018/0011247 | A1 * | 1/2018 | Pfnuer ................... G02B 6/428 |
| 2018/0156972 | A1 * | 6/2018 | Kainuma ............... H05K 1/183 |
| 2019/0384002 | A1 * | 12/2019 | Lambert ............... H01S 5/4087 |
| 2021/0175682 | A1 * | 6/2021 | Okuda .................. H01S 5/327 |

OTHER PUBLICATIONS

Juodawlkis et al., "High-power, low-noise 1,5-μm slab-coupled optical waveguide (SCOW) emitters: physics, devices, and applications." IEEE Journal of Selected Topics in Quantum Electronics 17.6 (2011): 1698-1714.
Kapulainen et al., "Hybrid integration of InP lasers with SOI waveguides using thermocompression bonding." 2008 5th IEEE International Conference on Group IV Photonics. IEEE, 2008.
Kharas, Prototype Photonic Integrated Circuit (ProtoPIC) Platform and Applications. IMAPS New England. Jun. 19, 2018. 28 pages.
Morton et al., "High-power, ultra-low noise hybrid lasers for microwave photonics and optical sensing." Journal of Lightwave Technology 36.21 (2018): 5048-5057.
Morton et al., "Ultra low phase noise, high power, hybrid lasers for RF mixing and optical sensing applications." 2017 IEEE Avionics and Vehicle Fiber-Optics and Photonics Conference (AVFOP). IEEE, 2017. 2 pages.
Ohira et al., "On-chip optical interconnection by using integrated III-V laser diode and photodetector with silicon waveguide." Optics Express 18.15 (2010): 15440-15447.
Shimizu et al., "High density hybrid integrated light source with a laser diode array on a silicon optical waveguide platform for inter-chip optical interconnection." Group IV Photonics (GFP), 2011 8th IEEE International Conference on. IEEE, 2011. 3 pages.
Sorace-Agaskar et al., "Versatile Silicon Nitride and Alumina Integrated Photonic Platforms for the Ultraviolet to Short-Wave Infrared." IEEE Journal of Selected Topics in Quantum Electronics 25.5 (2019): 1-15.
Tanaka et al., "High-output-power, single-wavelength silicon hybrid laser using precise flip-chip bonding technology." Optics Express 20.27 (2012): 28057-28069.
Tanaka et al., "High-power flip-chip-bonded silicon hybrid laser for temperature-control-free operation with micro-ring resonator-based modulator." Optoelectronic Interconnects XIII. vol. 8630. International Society for Optics and Photonics, 2013. 9 pages.
Theurer et al., "Flip-Chip Integration of InP and SiN." IEEE Photonics Technology Letters 31.3 (2019): 273-276.

* cited by examiner
† cited by third party

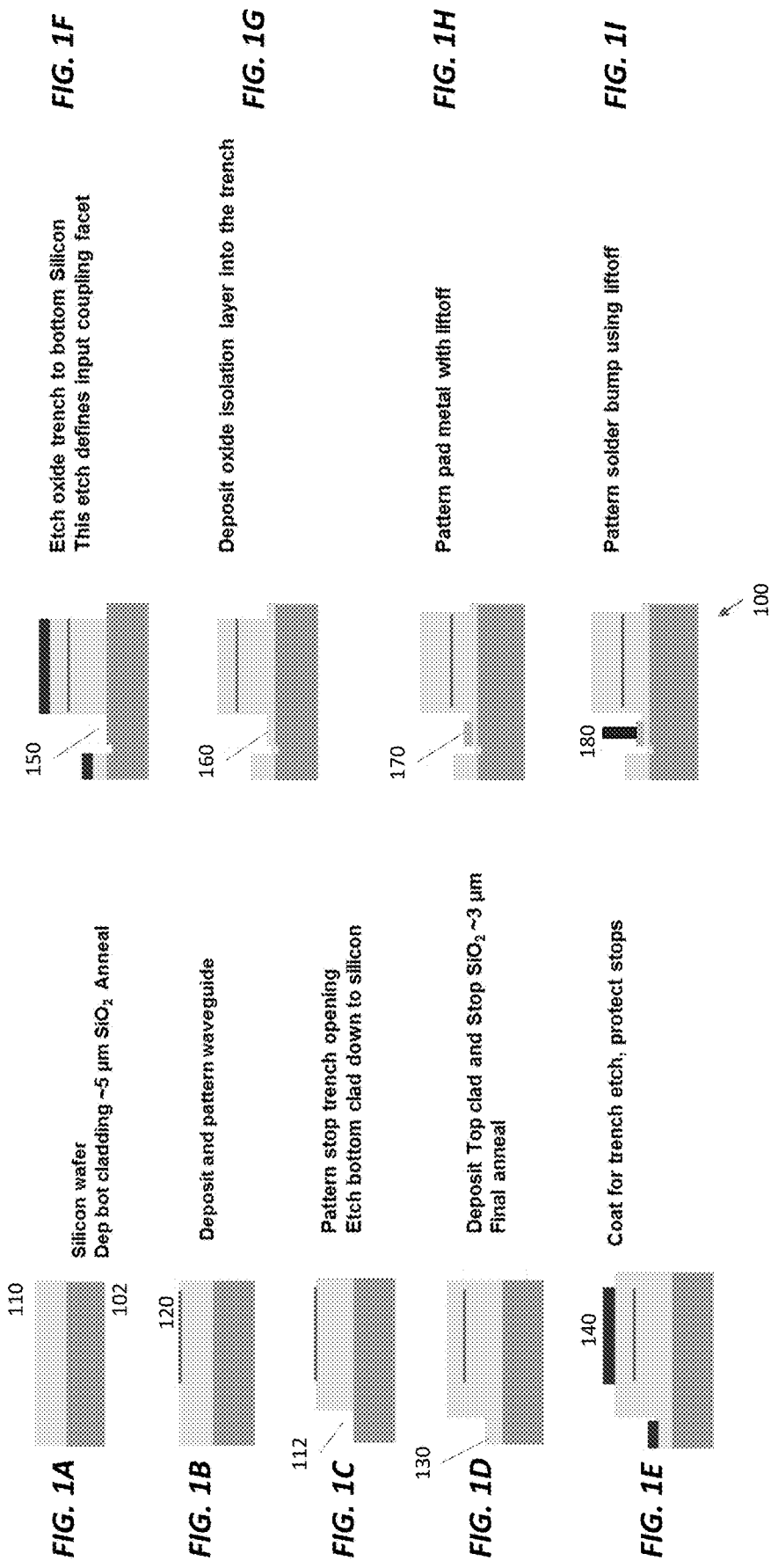

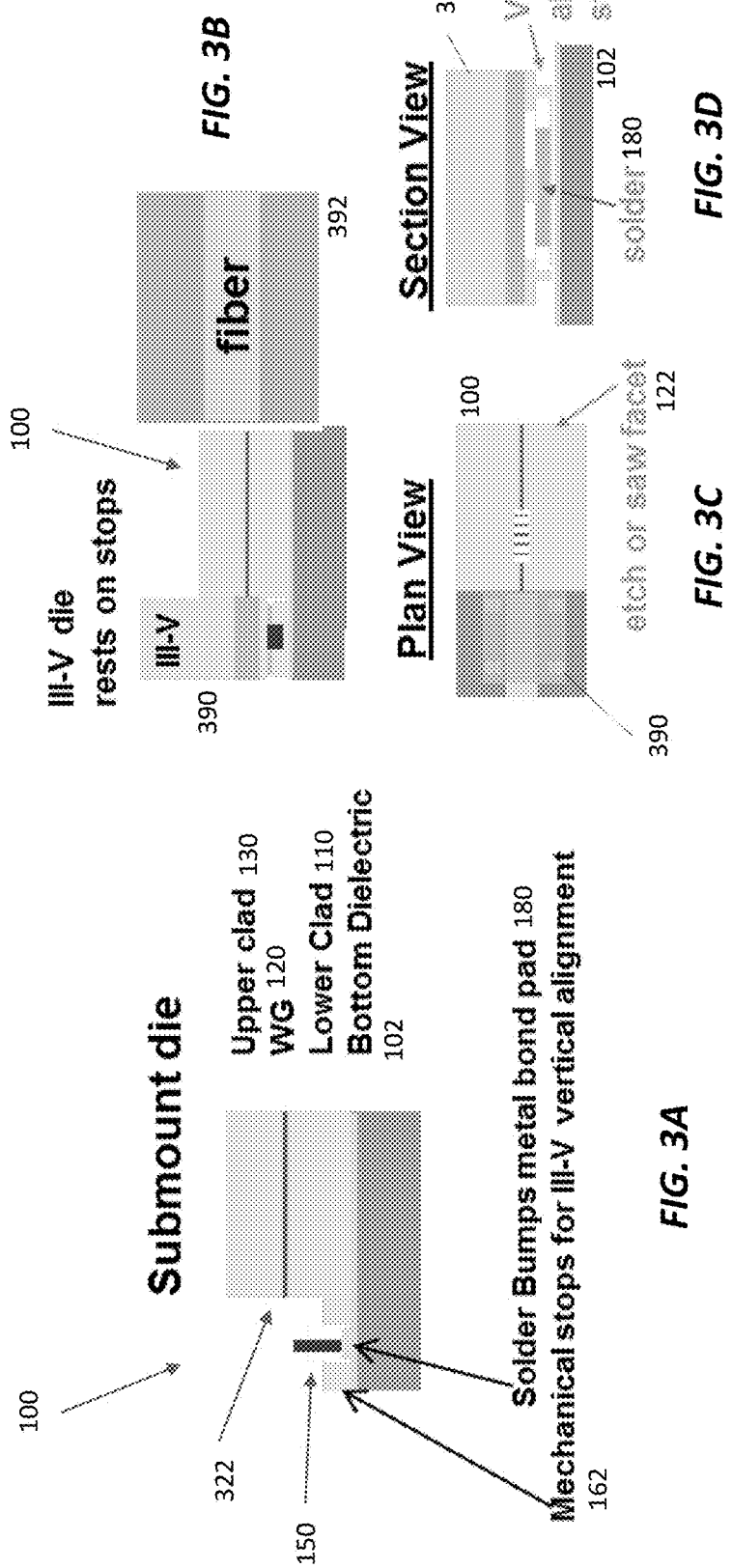

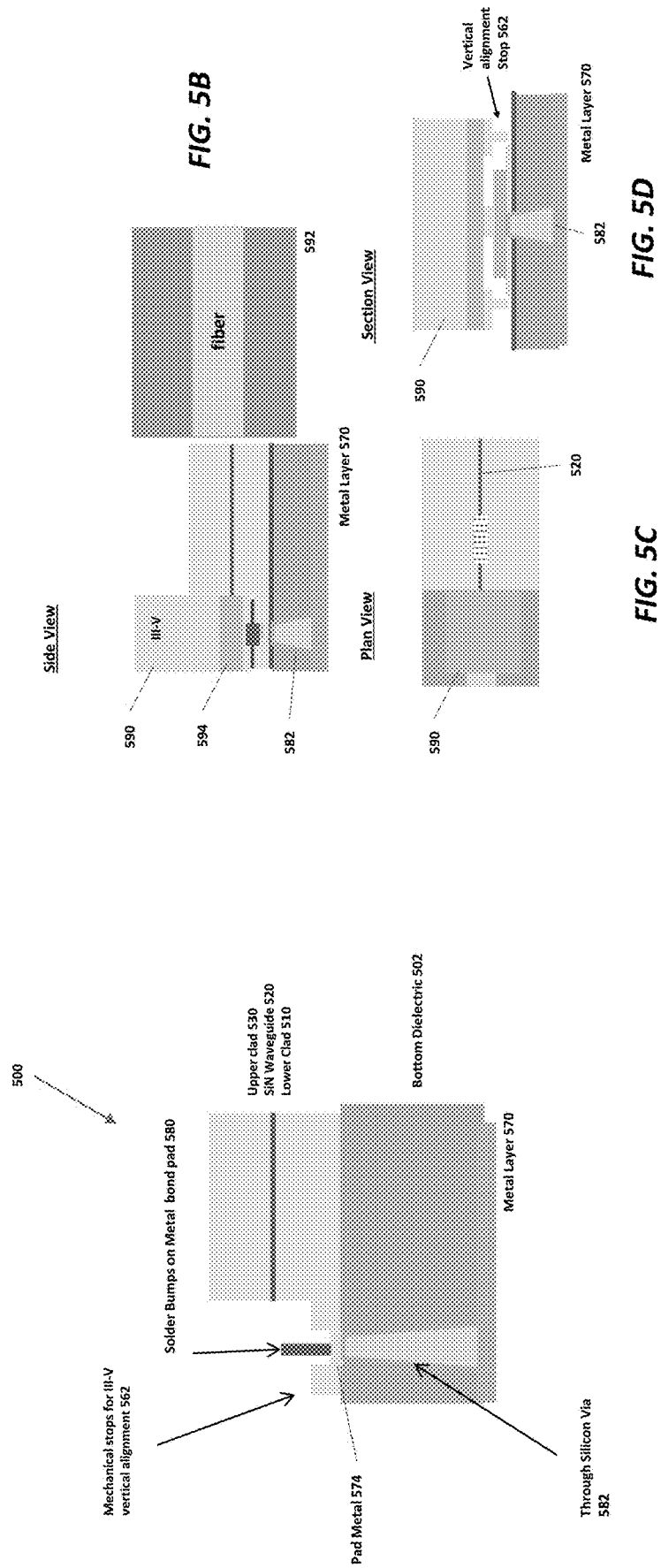

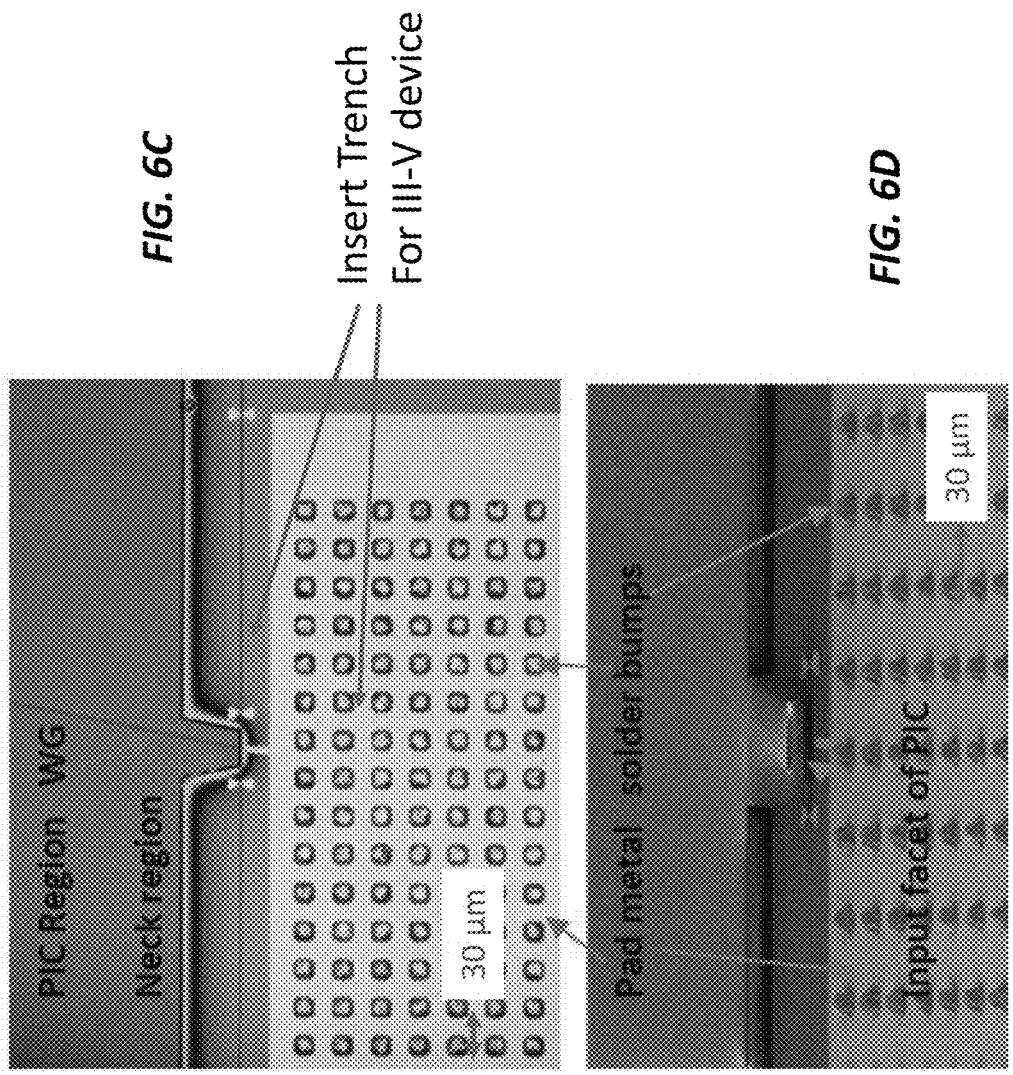
FIG. 6C
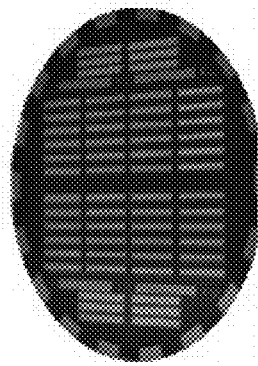
FIG. 6A
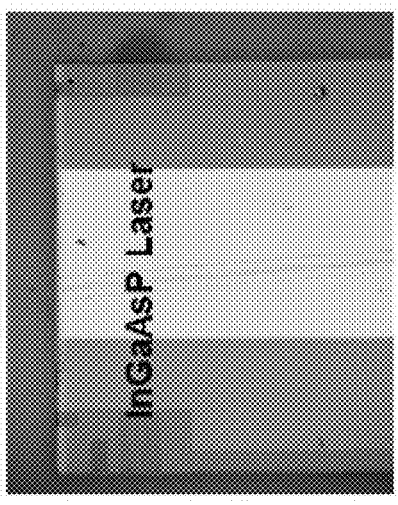
FIG. 6B
FIG. 6D

Standard Rib Waveguide

Slab-Coupled Optical Waveguide Amplifier (SCOWA)

HYBRID INTEGRATION FOR PHOTONIC INTEGRATED CIRCUITS

CROSS-REFERENCE TO RELATED APPLICATION(S)

This application claims the priority benefit of U.S. Application No. 62/814,413, filed Mar. 6, 2019, which is incorporated herein by reference in its entirety for all purposes.

GOVERNMENT SUPPORT

This invention was made with Government support under Grant No. FA8702-15-D-0001 awarded by the U.S. Air Force. The Government has certain rights in the invention.

BACKGROUND

Photonic integrated circuits (PICs) enable manipulation of light on a chip, e.g., for communications or information processing. Most PICs are fabricated in silicon substrates, which can be patterned to form on-chip modulators and photodetectors, but not light sources or optical amplifiers. Most light sources and optical amplifiers are fabricated in III-V materials, such as GaAs, which are incompatible with the complementary metal-oxide-semiconductor (CMOS) processes used to make silicon PICs. Similarly, lithium niobate modulators and germanium photodetectors cannot be fabricated in silicon substrates. What is needed is a way to combine silicon PICs with devices made in materials that incompatible with silicon processing.

SUMMARY

We present techniques for hybrid integration of photonic chips with photonic integrated circuits (PICs). This platform can be used to couple light between a PIC and one or more secondary photonic devices that are typically fabricated in material systems that are not native to a silicon-based fabrication process. These secondary photonic devices include light sources, lasers, semiconductor optical amplifiers (SOAs), slab-coupled optical waveguide amplifiers (SCOWAs), photodetectors, and modulators made in III-V, II-VI, and other material systems. These techniques are especially useful for fabricating narrow-linewidth, external-cavity hybrid lasers, photodetector arrays coupled to signal distribution PICs, and optical amplifiers.

The hybrid integration technology may have several elements, including: (1) a PIC with a silicon oxide ($SiO_2$) top and bottom cladding surrounding a deposited waveguide core made of a higher index material, such as silicon nitride, silicon oxynitride, or aluminum oxide; (2) a trench that is etched into the PIC and that is sized to accept a photonic chip; and (3) silicon oxide pedestals inside the trench that act as mechanical stops and provide vertical registration for the photonic chip with respect to the waveguide in the PIC (this enables alignment of the waveguide in the PIC to a waveguide in the photonic chip with <0.5 μm tolerance).

The PIC may also include an electrical pad in the trench between or next to the silicon oxide pedestals. A layer of dielectric material, such as silicon oxide, at the trench bottom electrically isolates the electrical pad from the substrate of the PIC. Solder bumps patterned on the electrical pad facilitate flip-chip attachment of the photonic chip to the PIC. The solder bumps and/or an additional metal layer on the electrical pad provide an electrical connection to the bottom contact of the photonic chip. Electrically conductive adhesives can also be used to provide both mechanical adhesion and electrical contact between the photonic chip and the PIC. In either case, the electrical connection can extend out from underneath the photonic chip or connected to a through silicon via (TSV) in the PIC.

The metal layer may also have alignment and measurement marks that enable flip-chip bonding of the photonic device to the PIC with alignment precision better than about 1.0 μm. The marks can be used by both a bonding camera vision system to align the photonic chip (e.g., a III-V device) laterally with respect to the PIC and for post-bonding metrology. Vernier markings can be used for fine tuning the alignment and for post-bond inspection using IR microscopy. An infrared (IR) microscope can image through the bonded stack to show how the metal marks on the PIC line up with marks on the photonic chip.

A photonic chip, such as a Slab Coupled Optical Waveguide Amplifier (SCOWA) with a transverse mode diameter of at least than 3 μm or chip made of III-V or II-VI material, can be integrated with a PIC as follows. A bottom cladding with a thickness of at least 3 μm (e.g., 3 μm, 4 μm, 5 μm, or thicker) is formed on a substrate of the PIC, and a waveguide core is formed on the bottom cladding. This height is selected to accommodate the mode emitted by the SCOWA, which may have a radius of up to 3 μm. If the cladding is too thin, then some or all of the SCOWA output may couple into the PIC substrate, where it can be absorbed, increasing loss.

A surface of the substrate next to the waveguide core is exposed, the coated with a dielectric layer that extends over and forms a top cladding on the waveguide core. This dielectric layer is patterned to form a dielectric pedestal (also called a mechanical stop) next to a recess. (Optionally, the dielectric layer can be annealed before it is patterned to form the dielectric pedestal.) The photonic chip is placed on the dielectric pedestal and aligned with the waveguide core.

Placing the photonic chip on the dielectric pedestal may include aligning the waveguide core to within 0.5 μm of a waveguide in the photonic chip. It can also include electrically connecting the photonic chip to the silicon PIC. In this case, an electrical connection can be formed between the photonic chip and a back side of the substrate through a through-silicon via (TSV).

In some cases, the dielectric layer is a first dielectric layer. In these cases, before the photonic chip is placed on the dielectric pedestal, a second dielectric layer is deposited over at least portion of the recess. Pad metal is deposited on at least a portion of the second dielectric layer. A solder bump is patterned on the pad metal, then used to bond the photonic chip to the pad metal.

If desired, an electrode can be formed in the PIC and electrically connected to the photonic chip. The electrode can be formed by depositing and patterning a first metal layer in the recess. Dielectric material is deposited over at least a portion of the first metal layer. And a second metal layer is deposited in electrical communication with the first metal layer.

A plurality of lateral alignment marks can be formed on the PIC for laterally aligning the photonic chip to the PIC. For example, if the waveguide core is part of a first waveguide array formed in the PIC, the lateral alignment marks can be used to align the first waveguide array to a second waveguide array formed in the photonic chip.

Other methods for integrating a photonic chip with a PIC include forming a waveguide in the PIC, forming a recess in the PIC, forming a dielectric pedestal in the recess, and disposing the photonic chip on the dielectric pedestal such that a waveguide in the photonic chip is vertically and laterally aligned to the waveguide, which terminates at the facet. The photonic chip can be bonded to conductive material on a bottom surface of the recess. If desired, the conductive material can be patterned to form an electrode.

A III-V photonic chip can be integrated with a PIC formed in a silicon substrate by depositing a first silicon oxide layer on the silicon substrate. This first silicon oxide layer forms a bottom cladding of a PIC waveguide. Silicon nitride is deposited on a first portion of the first silicon oxide layer, then patterned to form a core of the PIC waveguide. A second portion of the first silicon oxide layer is etched to expose a portion of the silicon substrate. A second silicon oxide layer is deposited over the portion of the silicon substrate and the core of the PIC waveguide to form a top cladding of the PIC waveguide. A trench is etched through the first silicon oxide layer and/or the second silicon oxide layer to define a coupling facet of the PIC waveguide and a mechanical stop. (If desired, the first and/or second silicon oxide layers can be annealed before etching the trench.) A third silicon oxide layer is deposited within at least a portion of the trench, with pad metal deposited on a portion of third silicon oxide layer. A solder bump is formed on the pad metal. And the III-V photonic chip is bonded to the pad metal with the solder bump such that the mechanical stop aligns a photonic chip waveguide in the III-V photonic chip to the coupling facet of the PIC waveguide.

An electrical connection can be formed between the pad metal and a metal layer on the silicon substrate before forming the solder bump on the pad metal. Before bonding the III-V photonic chip to the pad metal with the solder bump, the pad metal can be patterned to form an electrode. Optionally, or in addition, lateral alignment marks can be formed on the PIC for aligning the PIC to the III-V photonic chip.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A-1I illustrate a process of forming pedestals and an electrical pad in a silicon photonic integrated circuit (PIC) for aligning and bonding a photonic chip to the silicon PIC.

FIGS. 3A-3D shows a schematic of a III-V photonic chip integrated onto a silicon PIC with vertical pedestals and an electrical pad formed by using the process of FIGS. 1A-1I.

FIGS. 5A-5D show different views of a HIPIC submount with a through silicon via (TSV) electrical connection to a III-V chip integrated with the PIC.

FIG. 6A shows a photograph of a 2-inch wafer (PIC) with completed InGaAsP laser insert devices.

FIG. 6B is a close-up of the front of a singulated insert device from the PIC in FIG. 6A.

FIG. 6C is an optical microscope image of the insert location of a HIPIC device, showing a SiN waveguide in the PIC region coming to a neck region of the input facet of the insert trench. Also visible is the gold bottom pad sitting in the trench and solder bumps for making electrical contact and mechanical adhesion to the III-V photonic chip.

FIG. 6D shows a tilted scanning electron microscope (SEM) image of the structure in FIG. 3C showing that the metal pad sits at the bottom of the insert trench.

DETAILED DESCRIPTION

Figures 2A, 2B, 2C, 2D, 2E:
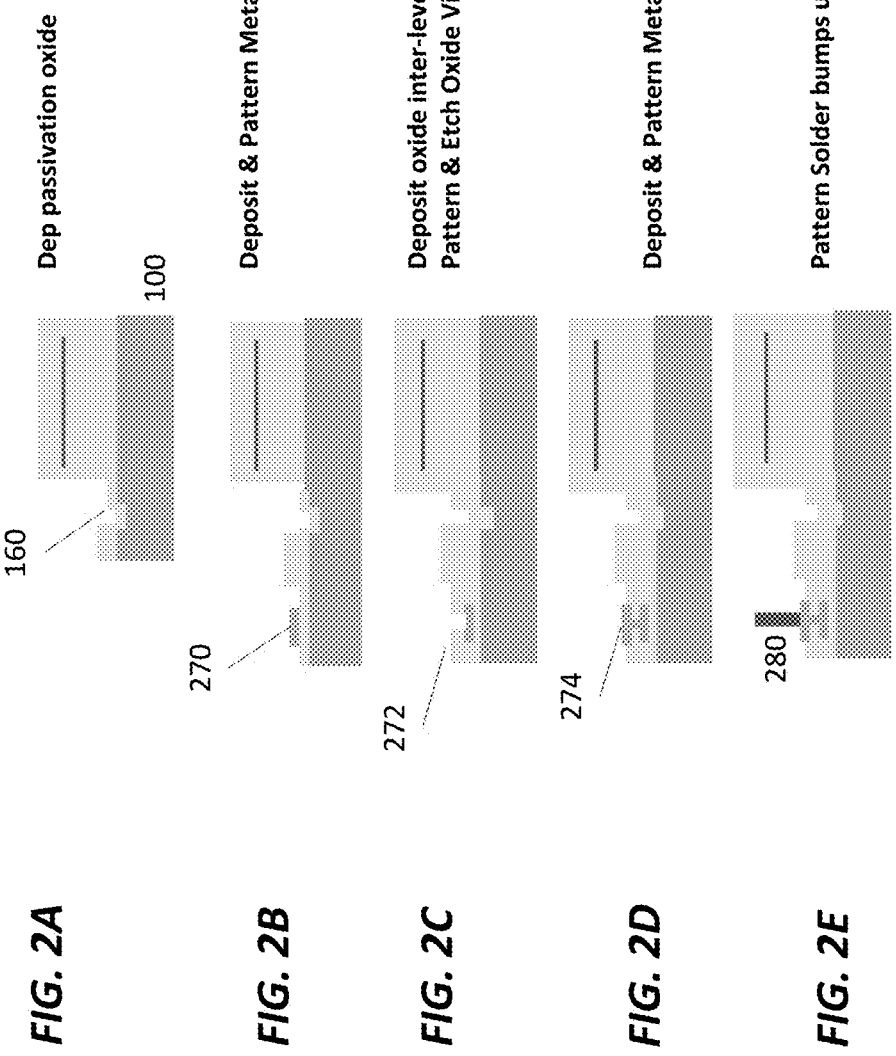
FIGS. 2A-2E illustrate an alternative process of forming pedestals and an electrical pad in a silicon PIC for aligning and bonding a photonic chip to the silicon PIC.

Silicon-based photonic integrated circuits (PICs) have been finding increased applications in high-speed optical telecommunications, enabling transmission, modulation, and detection of infrared (IR) light in the C, L, and O wavelength bands. However, silicon waveguides absorb light outside the IR wavelength range and suffer from two-photon absorption. These drawbacks limit the usefulness of silicon waveguides at wavelengths other than IR wavelengths and at optical power levels greater than about 100 mW. Waveguides in other materials, such as silicon nitride waveguides in dielectric-based PICs, can guide light that spans blue to IR wavelengths and have much higher optical power handling capabilities.

For both silicon and dielectric-based PICs, there is a desire to combine the PICs with photonic components, such as light sources, lasers, semiconductor optical amplifiers (SOAs), modulators, and photodetectors, that cannot be fabricated in silicon and are more frequently fabricated using compound semiconductor III-V materials. These photonic components are often made as photonic chips with waveguide and cladding layers fabricated by epitaxial layer growth of various composition semiconducting layers. The thickness of each epitaxial layer (epi) is generally known with very high (e.g., nanometer-level) precision from in situ and ex situ film growth metrology, allowing ease of determination of the waveguide position relative to the epi surface of the photonic chip.

During the fabrication of a photonic chip, the epi layer is often patterned and etched into a rib structure that helps to confine light in a lateral direction. The etch-exposed rib surface is capped with a dielectric passivation layer typically deposited using physical or chemical vapor deposition (PVD or CVD). The dielectric layer is opened up to create windows into which metal contacts are deposited. The thickness of the dielectric passivation film can be deposited with very high precision, e.g., precision better than 0.5-2.0% film thickness uniformity.

For a photonic chip, the dielectric thickness is typically known with finer precision than the metal contact pad thickness, which is often made from a stack of several independent metal layers. Thus, the center axis of the waveguide in the photonic chip can be better determined from measuring from the dielectric passivation surface rather than the metal pad surface, making the metal pad surface the preferred mating surface for accurate vertical registration during flip chip attachment to a support surface on a PIC. A typical optical waveguide in a photonic chip is 0.5-5 µm from the top surface of the photonic chip.

For fabricating a PIC, an oxide bottom cladding is deposited onto a silicon substrate using low-pressure or plasma-enhanced CVD (LPCVD or PECVD). Bottom clad oxide may also be formed by thermal oxidation; however, the thickness can be limited by the time it takes to grow a sufficiently thick oxide film. Several layers of oxide can be deposited to build up the height of the bottom cladding. The thicker bottom cladding better confines the optical mode to the waveguide, preventing the optical mode from being absorbed by the substrate.

After the bottom cladding has been deposited, it may be annealed at high temperatures to remove hydrogen and stabilize the film. Residual hydrogen may be present from deposition byproducts of the CVD process and can absorb IR light. After bottom cladding deposition, a waveguide material is deposited by CVD, atomic layer deposition (ALD), or PVD. The waveguide and other optical elements (e.g., ring filters, Mach Zehnder, splitters, grating couplers, grating elements) are patterned using a standard lithographic process, and then etched using a plasma etch. A top oxide cladding can then be deposited.

The oxide top and bottom cladding are typically 1-5 µm in thickness, while the waveguide layer typically measures from 50-800 nm. The bottom cladding thickness can be chosen to position the waveguide at a suitable height (e.g., 3 µm, 4 µm, 5 µm, or more) above the substrate surface to enable desired registration of the PIC with a photonic chip. High temperature annealing of the top and bottom oxide cladding may also reduce the optical loss within the waveguide. It is therefore advantageous to fabricate the waveguide stack prior to etching a trench to accept the photonic chip, thus enabling any high temperature processing to be completed prior to any metal pad and stop fabrication.

For hybrid integration of a photonic chip with a silicon PIC fabricated in a silicon-on-insulator (SOI) wafer, it can be advantageous to form pedestals in the substrate silicon or buried oxide layer. These pedestals form mechanical stops for flip-chip support and vertical registration of the photonic chip with respect to the silicon PIC. The support pedestals provide independent control of the vertical positioning of the photonic chip, eliminating the need to rely on the combination of pad metal, bonding material (solder or conductive epoxy), and photonic chip pad metal in defining the gap between the top of the substrate exposed in the trench and the photonic chip.

Pedestal fabrication can be accomplished using timed etches or etch stops at the interfaces in the SOI PIC, including the interface between the silicon upper layer and buried oxide (BOX) layer in the SOI wafer and the interface between the BOX layer and the silicon substrate in the SOI wafer. However, for a PIC with a deposited waveguide and deposited oxide cladding with a thickness on the order of 10 µm, there are no intermediate height stop layers, so the formation of mechanical stops can be more challenging. The use of a timed etch to define the vertical height of the stop is feasible; for example, one could etch a trench to a partial depth, mask the areas for the mechanical stops, and then etch the trench to the bottom. However, deep etching tends to be highly non-uniform, so it yields a wide range of stop height positions across the wafer, resulting in poor vertical alignment of the photonic chip relative to the PIC waveguide.

The use of a buried etch stop layer to define the pedestal is also feasible and involves placing a thin etch-stop material into the dielectric stack at the appropriate height. The pedestal is formed using an etch that is highly selective to this etch-stop material (e.g., with a selectivity of >10:1). In practice this approach is quite challenging, since the support pedestals should be about 1 µm to 5 µm high. This means that the etch stop material may be exposed to the etch for the duration of the pedestal definition. Exposing the etch stop for this long can result in varying amounts of the etch stop erosion, which in turn causes pedestal height non-uniformity.

Making a PIC Submount with Precise Vertical Registration Stops

FIGS. 1A-1I show a more accurate method for making vertical registration stops in a PIC than using a timed etch. This process takes advantage of the uniformity of deposited CVD oxide films, which have less than 2% thickness non-uniformity across a 200 mm wafer. In FIG. 1A, a relatively thick layer (e.g., 3 µm, 4 µm, 5 µm, or thicker) of silicon oxide 110 is deposited on a silicon substrate 102 to form the bottom cladding of a waveguide. Next, silicon nitride 120 is deposited and patterned on the silicon oxide 120 to form the waveguide core (FIG. 1B). After the fabrication of bottom cladding and core waveguide layers (FIGS. 1A and 1B, respectively), a trench 112 is etched through the silicon oxide 120 down to the surface of the silicon 102 in the locations that will receive the mechanical stops (FIG. 1C). The trench can range in size from 10-500 microns wide and 10-500 microns long. The etch down to the silicon substrate can be accomplished with high selectivity with very little or no over-etch into the silicon substrate 102. This can be done with a plasma etch or a combination of plasma and wet etching.

After the trench 112 for the mechanical stops are open, a top cladding 130 (e.g., a 3-micron-thick layer of silicon oxide) can be deposited to complete both the waveguide stack and form the mechanical stop height (FIG. 1D). Alternatively, the stop trench(es) 112 can be opened after a partial deposition of the top cladding layer 130. Then a final oxide trench etch is used to open the large recess 150 that will accept the photonic chip (FIG. 1F). Before the recess etch, the deposited stops are covered with resist 140, preserving the stop height (FIG. 1E). There may be any suitable number of mechanical stops, with any suitable shapes and arrangements. In general, the mechanical stops should support the III-V chip mechanically without decreasing the yield due to surface particles landing on the stops or the III-V device and interfering with gap-free placement of the III-V device and the stops.

The vertical edge of the recess 150 also forms the input coupling surface to the PIC. The vertical edge of the recess 150 may form an angle of about 80-90 degrees (e.g., 87, 88, 89, or 90 degrees) with the bottom of the recess 150. An isolation oxide 160 is deposited to provide electrical isolation between pad metal and the silicon substrate (FIG. 1G).

The recess 150 is shaped to be oversized relative to the photonic chip, which may have lateral dimensions of 1 mm by 5 mm, 2 mm by 8 mm, 18 mm by 20 mm, etc., thus taking into consideration that photonic chips that are fabricated in the III-V system are often singulated using cleaving techniques which results in chip dimensions that can deviate by tens of microns from their design size. For example, the recess 150 may be slightly larger (e.g., 1-50 microns wider and/or longer) than the III-V device that is being inserted into the recess 150. For a III-V chip that is 2 mm wide by 8 mm long, the recess may be about 2.1 mm wide by about 8.002 mm long.

Cleaving of the photonic chips can result in angled edges depending on the crystalline miscut of the growth substrates and the accuracy with which the photonic chip fabrication masks were aligned to crystallographic cleave planes of the growth substrate wafer. If the epitaxial layer is grown on an off-axis GaAs substrate, then its edge facets may be angled. Epitaxial silicon is sometimes grown on off-cut substrates to improve the material growth properties (e.g., 2-15 degrees off-axis is not uncommon).

Figures 7A, 7B, 7C:
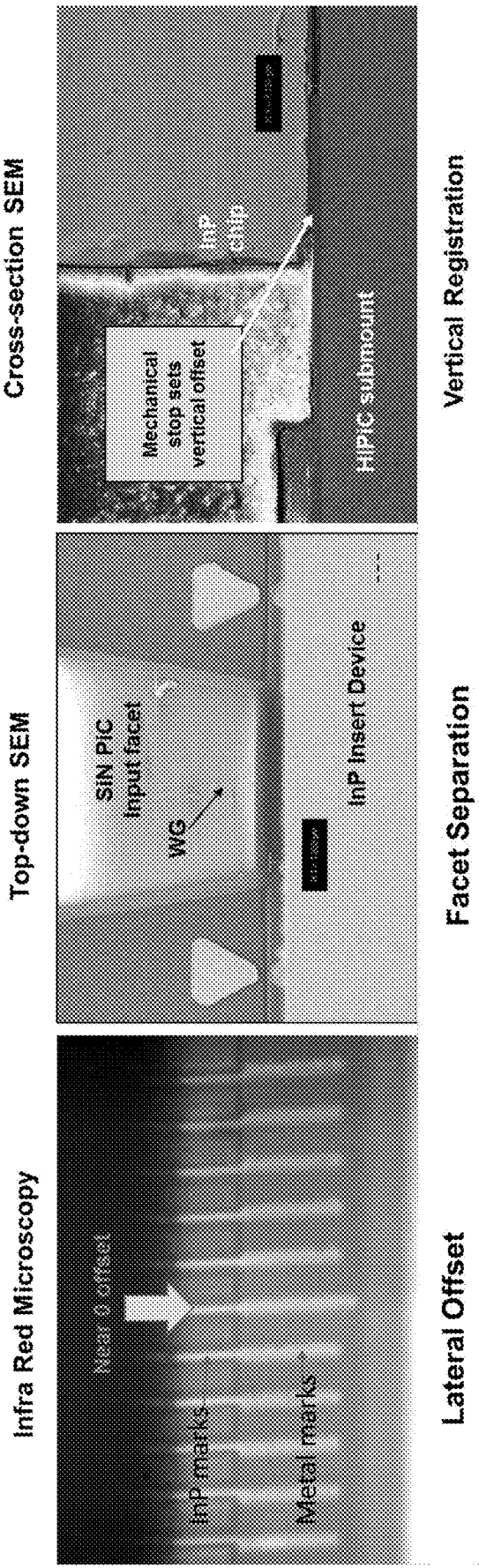
FIG. 7A shows an infrared (IR) microscopy image, looking through a bonded InP insert device at the bond interface, showing Vernier marks patterned in the III-V device (photonic chip) overlaid with complimentary Vernier marks patterned in the pad metal showing near 0 lateral offset.
FIG. 7B show a top down view of an InP device insert device with a stand-off from the SiN PIC input facet. There is a small gap during the bonding to avoid crushing the III-V device into the ledge of the SiN PIC.
FIG. 7C shows a cross-sectional SEM image of an InP insert device sitting on a 3.1 μm tall oxide pedestal. The pedestal provides a stand off from the silicon substrate to accommodate the pad metals of the III-V and SiN PIC submount and the melted interconnect solder.

A narrow neck region in the PIC submount die that extends the waveguide from the recess wall accommodates any material that may protrude from the photonic chip at the coupling interface, giving more mechanical accommodation to imperfections of the photonic chip edge and any rotational adjustments to increase or maximize placement accuracy. FIGS. 6C, 6D, and 7B show an example of this neck region in an actual PIC submount die. Typically, there may be at least 10 µm of oxide on the left and right sides of the waveguide, but there could be reasons to make the oxide thinner. In FIGS. 6C, 6D, and 7B, the input facet width is 30 µm, so there is 15 µm on either side of the waveguide.

A pad metal 170 can be formed inside the trench by using liftoff techniques (FIG. 1H), thus simplifying the fabrication process and avoiding the need to deposit and etch off unwanted metal from the sidewall of the input facet. Lateral alignment marks can be formed in the same layer as the pad metal 170. After liftoff of the pad metal 170, solder bumps 180 may also be of any suitable material (e.g., indium) formed by a liftoff or plating technique (FIG. 1I). The solder in the solder bumps 180 can spread out and occupy the volume between the PIC pad metal 170 and the photonic chip pad metal. The metal pad 170 can be brought out from underneath the footprint of the photonic chip to provide an electrical contact path.

Multi-Level Electrical Signal Routing and High-Speed Electrodes

FIGS. 2A-2E illustrate how additional metal layers can be deposited and patterned to provide for multi-level routing or formation of high speed (e.g., 10 GHz, 20 GHz, 40 GHz, or 80 GHz) electrodes that connect to a photonic chip mounted in the PIC submount. In FIG. 2A (FIG. 1G from the PIC submount fabrication process), dielectric film 160 may be deposited or coated on to at least part of the recess formed in the wafer. This dielectric film 160 may be about 10 nm thick to about 1 µm thick (e.g., 100-200 nm thick). Next, a first metal layer is deposited on at least part of that dielectric film and patterned to form a first pad metal 270 (FIG. 2B). This metal layer can be about 50 nm thick to about 1 µm thick (e.g., 500-1000 nm thick), depending on the desired current level to be carried by the first pad metal 270. More oxide (e.g., a layer 0.5-2.5 µm thick) is deposited on the first metal pad 270.

A via 272 may then be etched or lithographically defined through this oxide down to the first pad metal 270 (FIG. 2C). The size of this via 272 is typically limited by the lithography capability in the trench region and can be 1 µm, 5 µm, or larger. Then a second metal layer (e.g., 500-1000 nm thick) may be added and patterned to form a second pad metal 274 that connects to the first pad metal 270 through the via 272 (FIG. 2D). Additional metal and dielectric layers may be added into the trench as desired, with solder bumps 280 deposited on the top surface of the final layer (FIG. 2E), so long as the total metal and dielectrics height is below the stop height and there is enough room to accommodate the molten solder after the III-V chip is attached to the PIC. Typically, there is 2 µm gap between the top pad metal and the top of the stop to accommodate a 50-75% compression of the solder bump. If the III-V chip has room to accommodate the solder compression, then this spacing can be reduced. If on the metal pad on the III-V chip is depressed or indented relative to the stop mating surface, then this depression or indent can accommodate the solder compression. If desired, a final oxide trench may be etched through the top oxide and added dielectric layers to ensure that the PIC waveguide is positioned at the edge of the insert slot for hybrid coupling. Alternatively, a through silicon via (TSV) may be etched into the substrate to provide a higher current and better thermal path to the underlying pad metal.

Flip-Chip Bonding the Photonic Chip to the PIC

After fabrication, the photonic chip can be attached to the hybrid integration PIC platform using a precision flip chip bonder. Commercial bonders are now available that provide controlled temperature and pressure bonding recipes with placement accuracy of about 0.5 µm or better. Passive alignment is carried out, aligning the waveguide rib or other fiducial mark on the photonic chip surface to metal alignment marks that are patterned in the metal pad layer of the PIC chip. The photonic chip is flipped upside down and the dielectric passivation surface is brought into hard contact with the mechanical stops on the PIC platform. The height of the stops is chosen to provide optimal vertical alignment of the waveguides in and modes of light propagating between the photonic and PIC platform chips. In addition to the alignment marks on both the photonic and PIC substrate, there may be Vernier marks and/or overlay fiducials on the PIC substrate for measuring the lateral and offset positioning of the photonic and PIC platform chips using IR microscopy that can image through the flip chip to the bonding interface.

HIPIC Amplifiers, Photodetectors, and Other Devices

FIGS. 3A-3D show a silicon PIC submount die 100 made using the process of FIGS. 1A-1I with and without a III-V photonic chip 390, such as a laser, photodetector, or SOA. For a chip 390 with an external cavity laser, the waveguide in the PIC should be designed to form at least part of the external cavity. This can be done by forming a Bragg grating structure, ring filter, or combination thereof in or coupled to the waveguide. For a chip 390 with a photodetector, the PIC waveguide should guide light to the photodetector. And for a chip 390 with a SOA, the PIC waveguide may have a structure, such as a filter, that shields the SOA from back reflections.

FIG. 2A shows a profile view of the silicon PIC submount die 100 without the photonic chip. The silicon PIC submount die 100 has a bottom dielectric 102 under a waveguide, complete with waveguide core 120, lower cladding 110, and upper cladding 130, that ends at a facet 322. The facet 322 borders the recess 150, which has mechanical stops 162 for supporting the photonic chip 390 and solder bumps 180 for bonding the photonic chip 390 to the submount die 100.

FIG. 3B shows a profile view of the photonic chip 390 aligned vertically on the pedestals (mechanical stops) 162 and laterally on the electrical pad 180 to a waveguide in the silicon PIC submount die 100. The waveguide in the silicon PIC submount die 100 is in turn (optionally) coupled to an optical fiber 392. FIG. 3C shows a plan view of the photonic chip 390 aligned laterally to the waveguide in the silicon PIC submount die 100. And FIG. 3D shows a cross-sectional view of the photonic chip 390 on the pedestals (vertical alignment stops) 162 and solder bump 180 in the trench 150 in the silicon PIC submount die 100.

The photonic chip 390 can be a III-V photonic chip or it can made in another material system, including germanium. It can include an active component, such as a laser, amplifier, or photodetector, that either cannot be made in silicon or has been performance than the equivalent silicon component. The photonic chip 390 can include a single component, several different components, and/or an array of components.

Figure 3G:
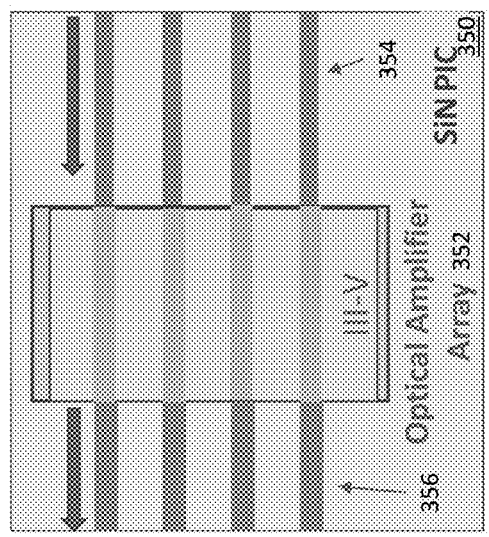
FIG. 3G shows a single-pass optical amplifier coupled to a PIC with input and output waveguides.
Figure 3F:
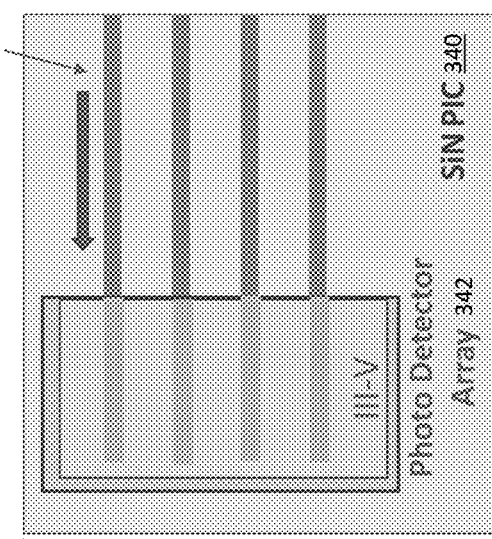
FIG. 3F shows an array of waveguide photodetectors coupled to a SiN PIC.
Figure 3E:
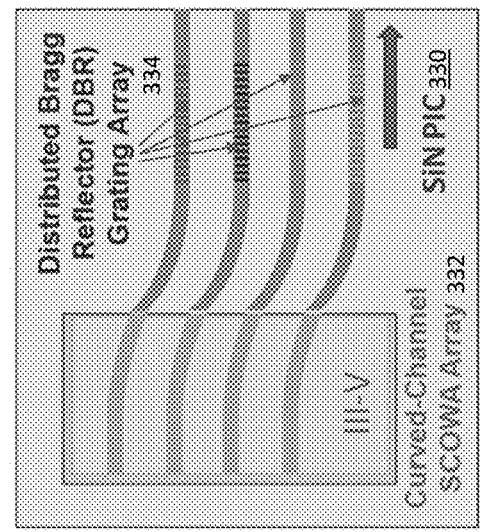
FIG. 3E shows a narrow-linewidth, external-cavity laser formed by combining a Slab Coupled Optical Waveguide Amplifier (SCOWA) with distributed Bragg reflector on a SiN PIC.

FIGS. 3E-3G show plan views of hybrid integrated PICs with photonic chips that contain arrays of components. FIG. 3E shows a curved-channel SCOWA array chip 332 integrated with a silicon nitride PIC 330. The silicon nitride PIC 330 includes a distributed Bragg reflector (DBR) grating array 334 that is aligned to the waveguides in the SCOWA array chip 332. FIG. 3F shows a photodetector array chip 342 integrated into a silicon nitride PIC 340 with a waveguide array 344 aligned to waveguides in the photodetector array chip 342. And FIG. 3G shows a III-V optical amplifier array chip 352 that is integrated into a silicon nitride PIC 350 with input waveguides 354 and output waveguides 356 aligned to the waveguides in the III-V optical amplifier array chip 352.

Figure 4B:
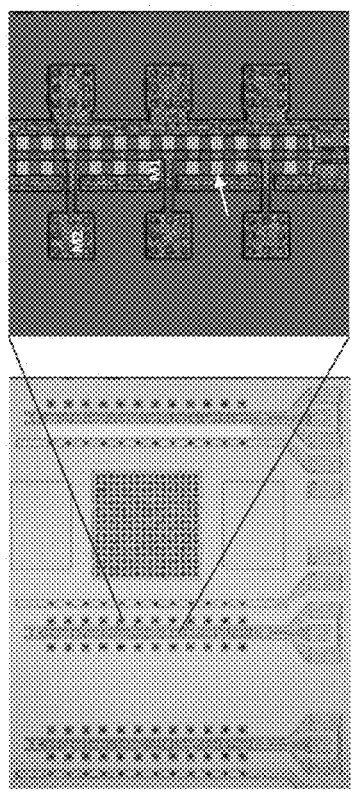
FIG. 4B shows a top down image of M1 and M2 traces inside an insert slot region in a PIC.
Figure 4A:
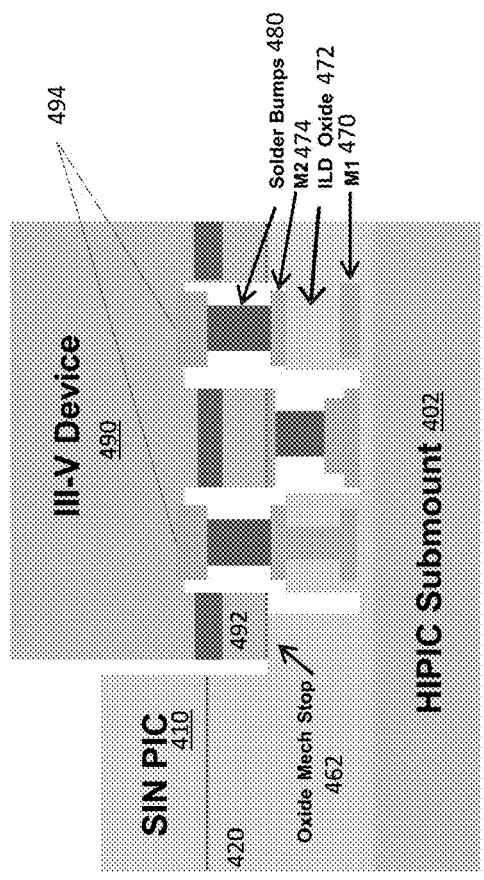
FIG. 4A shows a longitudinal cross-sectional view of a hybrid integrated PIC (HIPIC) submount with two layers of metal patterned to form electrical contacts for a III-V chip integrated with the PIC.

FIG. 4A shows a hybrid integrated PIC 400 with a III-V photonic chip 490 mounted to a HIPIC submount 402 that also supports a silicon nitride PIC 410. The photonic chip 490 rests on one or more oxide mechanical stops 462 extending from the submount 402. These mechanical stops 462 align the photonic chip 490 to the SiN PIC 410 so that a waveguide core 420 in the SiN PIC 410 lines up with a waveguide core 492 in the photonic chip 490, ensuring low coupling loss between the SiN PIC 410 and the photonic chip 490.

The photonic chip 490 is bonded to the submount 402 via solder bumps 480 that connect pad metal 494 on the bottom of the photonic chip 490 to pad metal 474 in the M2 layer of the submount 402. In some cases, the pad metal 474 in the M2 layer of the submount 402 connects through an oxide layer 472 to pad metal 470 in the M1 layer of the submount 402. This provides an electrical connection between the photonic chip 490 and the M2 layer in the submount 402. The M2 layer may in turn be electrically coupled to electronic components, power connections, etc. in the SiN PIC 410 and the submount 402 via one or more multilayer electrodes (not shown).

FIG. 4B shows a top down image of high speed electrodes formed in M1 and M2 inside an insert slot region.

FIGS. 5A-5D show different views of a photonic chip 590 mounted to a PIC 500 with a through-silicon via 582, whose dimensions depend on the substrate thickness and may be about 100-700 µm tall and 75-200 µm wide. As shown in FIG. 5A, the via 582 includes conductive material, such as gold, copper, or conductive polymer, that connects a metal layer 570 on one side of a bottom dielectric layer 502 (e.g., silicon oxide) to a gold-covered bond pad 574 at the bottom of a recess etched into the PIC 500. The metal layer 570 can electrically connect the through-silicon via 582 to an outside attach electronics board or ceramic interposer. A solder bump 580 connects the bond pad 574 to the photonic chip 590 as shown in FIGS. 5B and 5D. The photonic chip 590 rests on one or more mechanical stops 562, which have heights selected so that a waveguide 594 in the photonic chip 590 is vertically aligned with a waveguide core 520 in the PIC 500. The waveguide core 520 couples light between the waveguide 594 in the photonic chip 590 and an optical fiber 592, which is butt-coupled to the waveguide core 520.

Manufactured Hybrid Integrated PICs

FIGS. 6A-6D are images of the photonic chip and PIC submount die before integration. FIGS. 6A and 6B show InGaAsP laser chips before and after singulation, respectively. FIGS. 6C and 6D shows plan and perspective images of the PIC chip, including the recess with solder bumps for receiving the InGaAsP laser chip. The solder bumps are laid out in a two-dimensional, rectilinear array on pad metal in the bottom of the recess and provide both mechanical and electrical connections between the photonic chip and the PIC. An insert trench runs between the edge of the metal pad and the facet of the PIC that faces the photonic chip. A neck region of the PIC facet extends into the recess, with the end face of the waveguide (WG) exposed to the recess for coupling to a waveguide in the photonic chip. The neck region accommodates protrusions from the III-V device and metal centering marks to mark the desired insert position.

FIGS. 7A-7D are images of different features used to align an InP photonic chip to a PIC submount die in the hybrid integrated PIC fabrication process shown in FIGS. 1A-1I. FIG. 7A is an IR microscope image metal Vernier marks on the PIC and InP Vernier marks on the photonic chip for laterally aligning the photonic chip to the PIC. The two sets of marks have different widths and different pitches to measure absolute lateral alignment. In this case, when the longest metal mark is aligned to the gap between the central pair of InP marks, the photonic chip is laterally aligned to the PIC without any lateral offset.

FIG. 7B is a top-down scanning electron microscope (SEM) image of the neck region (FIGS. 6C and 6D) of a SiN PIC aligned to an InP photonic chip. It shows a small gap between the PIC facet and the InP photonic chip. This gap prevents the III-V device from bumping into the ledge of the SiN PIC. Triangular fiducial marks on either side of the neck region align to corresponding fiducial marks in or on the InP photonic chip when the InP photonic chip is aligned laterally to the PIC. A waveguide (WG) runs to the end of the neck region for butt-coupling to a corresponding waveguide in the InP photonic chip.

Figure 7D:
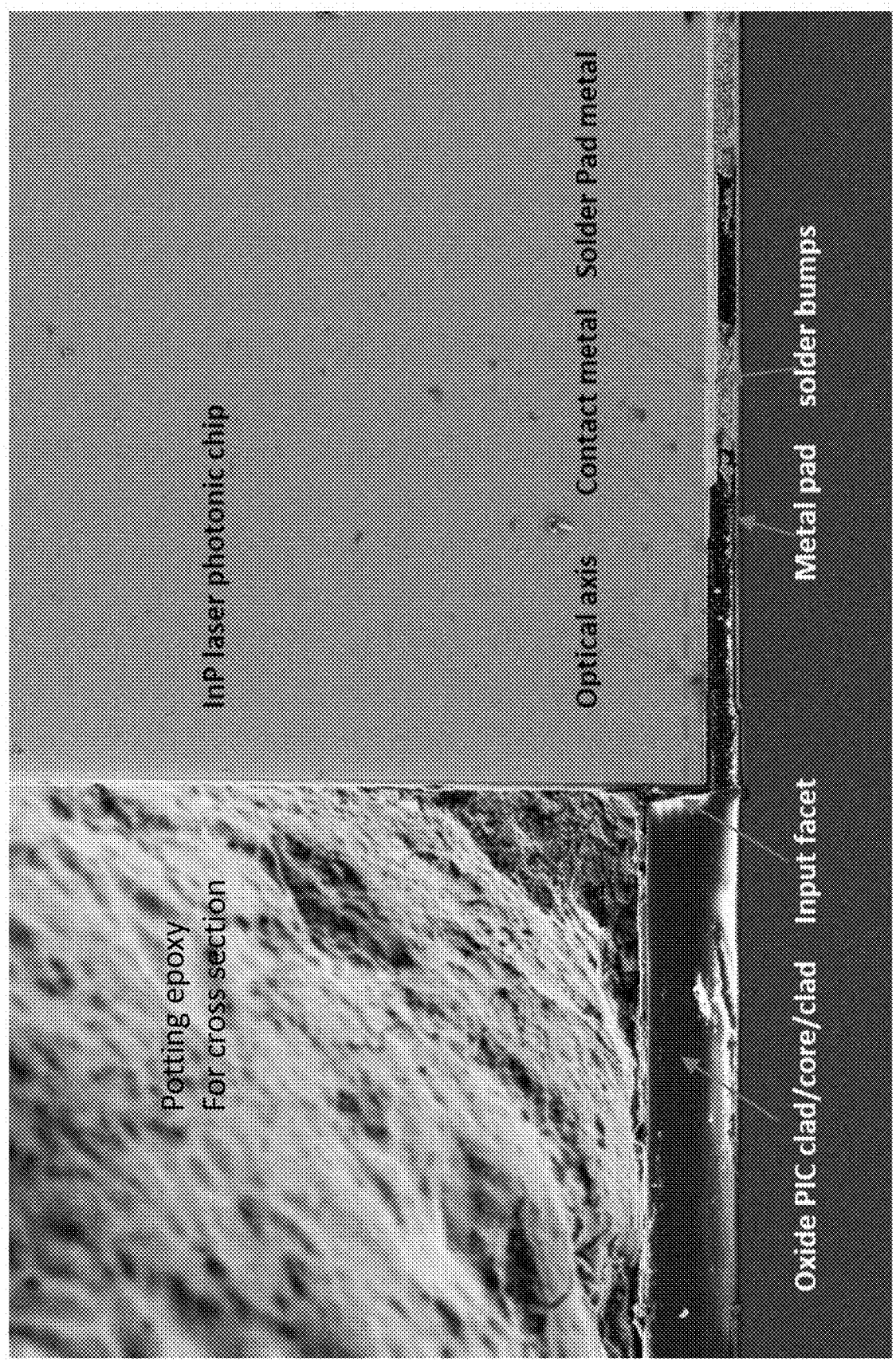
FIG. 7D is an SEM image of a cross section of a bonded InP chip and PIC input facet (the mechanical stops are off to the side of the chip and are not visible in this cross-section but appear in FIG. 7C).

FIGS. 7C and 7D are SEM images along the longitudinal cross section of the InP photonic chip integrated with the SiN PIC of FIGS. 7A and 7B. The InP photonic chip (insert device) sits on a 3.1 µm tall oxide pedestal (mechanical stop), visible in FIG. 7C. The pedestal provides a stand off from the silicon substrate to accommodate the pad metals of the InP photonic chip and SiN PIC submount and the melted interconnect solder (i.e., the melted solder bumps). FIG. 7D shows that this pedestal raises the photonic chip enough so that the optical axis of the laser in the photonic chip is vertically aligned with a waveguide in the PIC that terminates at the input facet to the PIC.

Figure 8C:
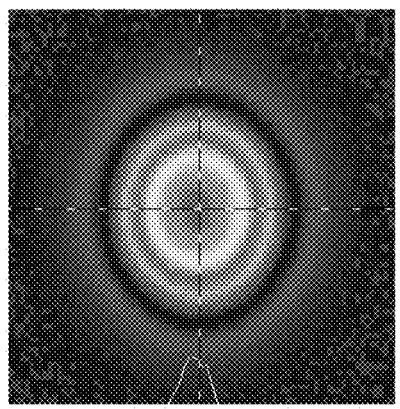
FIG. 8C shows the mode output from the laser device in FIGS. 8A and 8B.
Figure 8B:
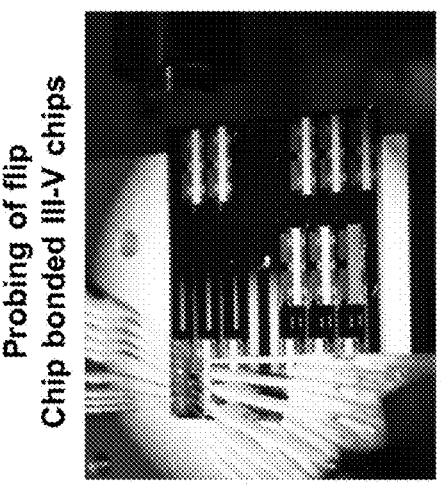
FIG. 8B shows the device of FIG. 8A under electrical-optical test.
Figure 8A:
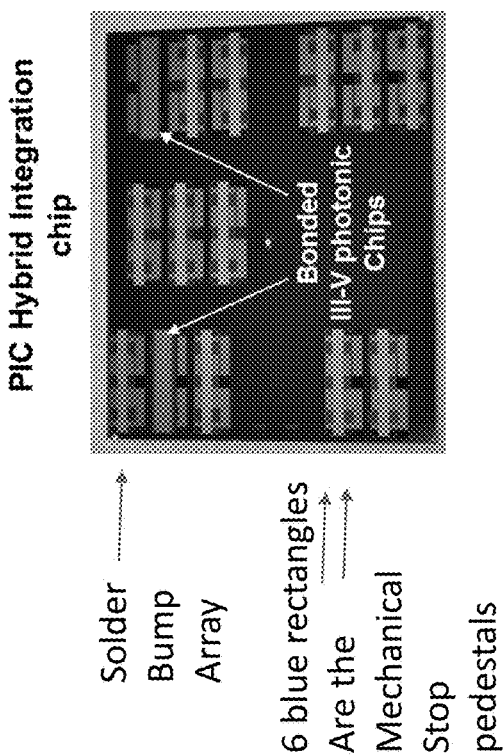
FIG. 8A shows optical images of a completed HIPIC submount with 14 insert locations, and 2 InP insert devices flip chip bonded into place.

FIGS. 8A-8C illustrate a PIC submount with enough recesses to accommodate fourteen different photonic chips. FIG. 8A shows a top view of the completed submount with two InP laser devices flip-chip bonded into two of the fourteen recesses. Each recess has six rectangular mechanical stops on either side of a solder bump array to support a photonic chip. FIG. 8B shows the device of FIG. 8A under electrical-optical test. And FIG. 8C shows the mode output from the laser device in FIGS. 8A and 8B.

Optical Mode Matching

To ensure low loss coupling between the photonic chip waveguide and the PIC waveguide, the optical modes propagating in those waveguides should be of similar size. Standard single-mode rib waveguide SOAs like the one shown in FIG. 9A have small mode field diameters, typically about 1-3 µm in diameter, that should have excellent coupling alignment in order to achieve low loss. An alternate SOA design called a Slab Coupled Optical Waveguide Amplifier (SCOWA) features larger mode sizes, e.g., 4-6 µm in diameter for a single transverse mode as shown in FIG. 9B, that reduce the alignment precision for achieving low coupling loss.

Figure 9C:
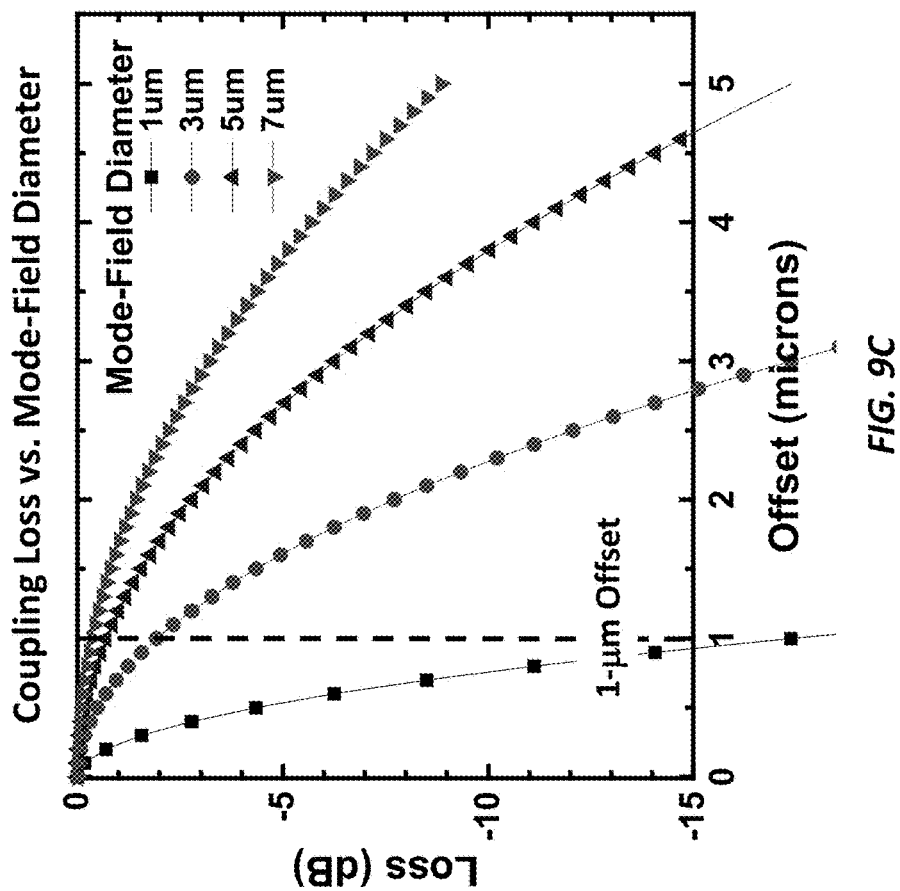
FIG. 9C is a plot of coupling loss versus offset for coupling optical modes with different mode-field diameters between the SOA of FIG. 9A and the SCOWA of FIG. 9B.
Figure 9A:
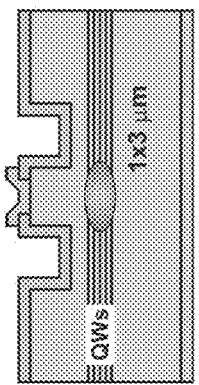
FIG. 9A shows a cross-section and typical mode field of a standard semiconductor optical amplifier (SOA) with a rib waveguide.
Figure 9B:
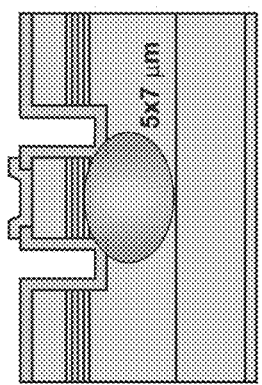
FIG. 9B shows a cross section and the larger mode field of a Slab Confined Optical Waveguide Amplifier (SCOWA) emitter.

FIG. 9C is a plot of coupling loss versus simulated lateral offset for coupling optical modes with mode-field diameters of 1 µm (squares), 3 µm (circles), 5 µm (upward-pointing triangles) and 7 µm (downward-pointing triangles) from a photonic chip, such as a SOA or SCOWA chip, into a PIC waveguide in a hybrid integrated PIC. The traces show that larger mode diameters result in lower coupling loss at all offsets, enabling better offset tolerance. Thus, a SCOWA photonic chip should have better coupling efficiency into a PIC waveguide than a SOA photonic chip thanks to the larger mode side.

Hybrid Integrated PIC Devices

Figures 10A, 10B:
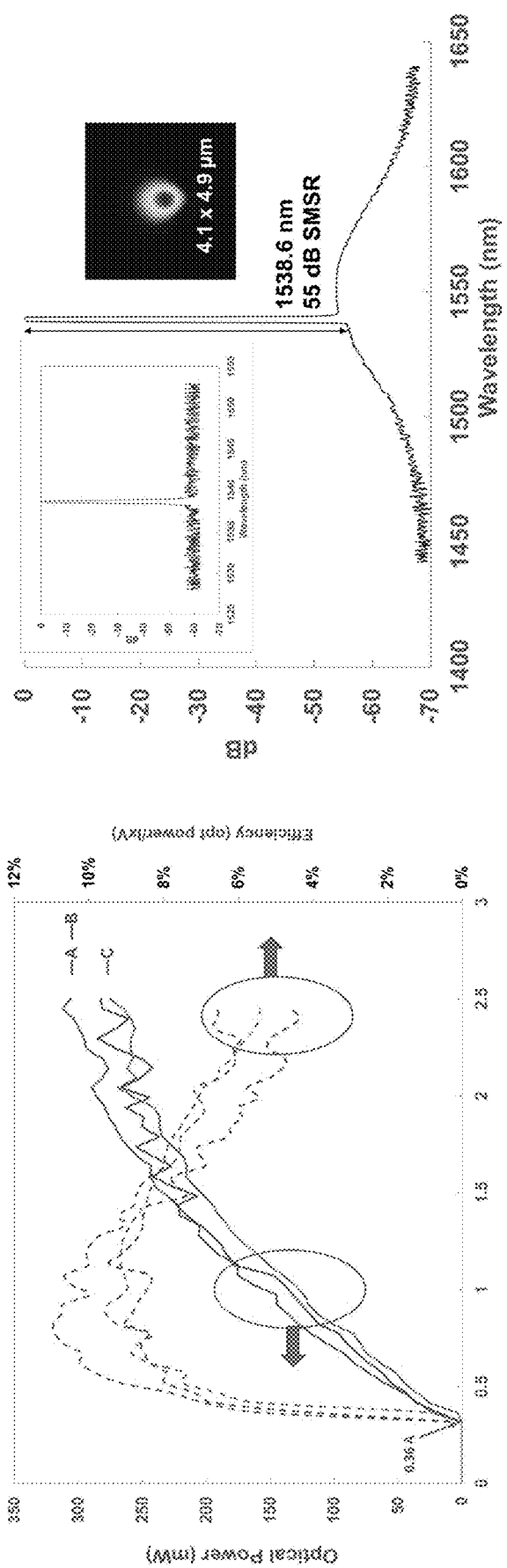
FIG. 10A shows optical power versus current for three HIPIC external cavity laser devices formed by coupling InGaAsP SCOWA devices with respective SiN PIC and DBR grating structures. The top-performing device exhibits >300 mW optical power at 2.5 A bias, with about 10% wall plug efficiency.
FIG. 10B shows a typical optical spectrum of a HIPIC laser devices with single mode operation and >55 dB side mode suppression. The inset image shows the output mode size from the SiN waveguide.

FIGS. 10A and 10B show measurements of the optical power and efficiency of three external HIPIC laser devices. FIG. 10B Optical Spectrum and mode size of the emitted beam. The HIPIC lasers emit >280 mW at 2.5 A bias and a wavelength of about 1550 nm with a side-mode suppression ratio (SMSR) of >55 dB.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of integrating a photonic chip with a photonic integrated circuit (PIC), the method comprising:
   forming a bottom cladding having a thickness of at least 3 μm on a substrate of the PIC;
   forming a waveguide core on the bottom cladding;
   exposing a surface of the substrate next to the waveguide core;
   forming dielectric layer on the surface of substrate next to the waveguide core and on the waveguide core, the dielectric layer on the waveguide core forming a top cladding;
   patterning at least a portion of the dielectric layer on the surface of substrate next to the waveguide core to form a dielectric pedestal next to a recess; and
   placing the photonic chip on the dielectric pedestal to align the photonic chip with the waveguide core.

2. The method of claim 1, wherein the photonic chip comprises at least one of a III-V or II-VI material.

3. The method of claim 1, wherein the photonic chip is a Slab Coupled Optical Waveguide Amplifier (SCOWA) with a transverse mode diameter of at least than 3 μm.

4. The method of claim 1, wherein placing the photonic chip on the dielectric pedestal comprises aligning the waveguide core to within 0.5 μm of a waveguide in the photonic chip.

5. The method of claim 1, wherein placing the photonic chip on the dielectric pedestal comprises electrically connecting the photonic chip to the silicon PIC.

6. The method of claim 5, further comprising:
   forming an electrical connection between the photonic chip and a back side of the substrate through a through-silicon via (TSV).

7. The method of claim 1, further comprising:
   annealing the dielectric layer before patterning the at least a portion of the dielectric layer to form the dielectric pedestal.

8. The method of claim 1, wherein the dielectric layer is a first dielectric layer, and further comprising, before placing the photonic chip on the dielectric pedestal:
   depositing a second dielectric layer over at least portion of the recess;
   depositing pad metal on at least a portion of the second dielectric layer;
   patterning a solder bump on the pad metal; and
   bonding the photonic chip to the pad metal with the solder bump.

9. The method of claim 1, further comprising:
   forming an electrode in the PIC; and
   electrically connecting the photonic chip to the electrode.

10. The method of claim 9, wherein forming the electrode comprises:
    depositing and patterning a first metal layer in the recess;
    depositing dielectric material over at least a portion of the first metal layer; and
    depositing a second metal layer in electrical communication with the first metal layer.

11. The method of claim 1, further comprising:
    forming a plurality of lateral alignment marks on the PIC for laterally aligning the photonic chip to the PIC.

12. The method of claim 1, wherein the waveguide core is part of a first waveguide array formed in the PIC, and wherein placing the photonic chip on the dielectric pedestal comprises aligning the first waveguide array to a second waveguide array formed in the photonic chip.

13. A method of integrating a photonic chip with a photonic integrated circuit (PIC), the method comprising:
    forming a waveguide in the PIC;
    forming a recess in the PIC, the waveguide terminating at a facet forming one side of the recess;
    forming a dielectric pedestal in the recess; and
    disposing the photonic chip on the dielectric pedestal such that a waveguide in the photonic chip is vertically and laterally aligned to the waveguide terminating at the facet.

14. The method of claim 13, further comprising:
    bonding the photonic chip to conductive material on a bottom surface of the recess.

15. The method of claim 14, further comprising, bonding the photonic chip to the conductive material:
   patterning the conductive material to form an electrode.

16. A method of integrating a III-V photonic chip with a photonic integrated circuit (PIC) formed in a silicon substrate, the method comprising:
   depositing a first silicon oxide layer on the silicon substrate, the first silicon oxide layer forming a bottom cladding of a PIC waveguide;
   depositing silicon nitride on a first portion of the first silicon oxide layer;
   patterning the silicon nitride to form a core of the PIC waveguide;
   etching a second portion of the first silicon oxide layer to expose a portion of the silicon substrate;
   depositing a second silicon oxide layer over the portion of the silicon substrate and the core of the PIC waveguide, the second silicon oxide layer over the core of the PIC waveguide forming a top cladding of the PIC waveguide;
   etching a trench through the first silicon oxide layer and/or the second silicon oxide layer, the trench defining a coupling facet of the PIC waveguide and a mechanical stop;
   depositing a third silicon oxide layer within at least a portion of the trench;
   depositing pad metal on a portion of third silicon oxide layer;
   forming a solder bump on the pad metal; and
   bonding the III-V photonic chip to the pad metal with the solder bump, the mechanical stop aligning a photonic chip waveguide in the III-V photonic chip to the coupling facet of the PIC waveguide.

17. The method of claim 16, further comprising, before etching the trench:
   annealing the first silicon oxide layer and/or the second silicon oxide layer.

18. The method of claim 16, further comprising, before forming the solder bump on the pad metal:
   forming an electrical connection between the pad metal and a metal layer on the silicon substrate.

19. The method of claim 16, further comprising, before bonding the III-V photonic chip to the pad metal with the solder bump:
   patterning the pad metal to form an electrode.

20. The method of claim 16, further comprising, before bonding the III-V photonic chip to the pad metal with the solder bump:
   forming lateral alignment marks on the PIC; and
   aligning the lateral alignment marks on the PIC to lateral alignment marks on the III-V photonic chip.

* * * * *

UNITED STATES PATENT AND TRADEMARK OFFICE
CERTIFICATE OF CORRECTION

PATENT NO. : 11,340,400 B2
APPLICATION NO. : 16/809640
DATED : May 24, 2022
INVENTOR(S) : Boris Kharas et al.

It is certified that error appears in the above-identified patent and that said Letters Patent is hereby corrected as shown below:

In the Claims

In Claim 1, Column 13, Line 64, replace "forming dielectric layer on the surface of substrate next to" with -- forming a dielectric layer on the surface of the substrate next to --

In Claim 1, Column 14, Line 2, replace "surface of substrate next to the waveguide core to form" with -- surface of the substrate next to the waveguide core to form --

In Claim 3, Column 14, Line 11, replace "a transverse mode diameter of at least than 3 µm" with -- a transverse mode diameter of less than 3 µm --

In Claim 5, Column 14, Line 18, replace "the photonic chip to the silicon PIC." with -- the photonic chip to the PIC. --

In Claim 8, Column 14, Line 30, replace "depositing a second dielectric layer over at least portion of" with -- depositing a second dielectric layer over at least a portion of --

In Claim 15, Column 15, Lines 1-2, replace "The method of claim 14, further comprising, bonding the photonic chip to the conductive material:" with -- The method of claim 14, further comprising: --

In Claim 16, Column 16, Line 1, replace "depositing pad metal on a portion of third silicon oxide" with -- depositing pad metal on a portion of the third silicon oxide --

Signed and Sealed this
Twenty-ninth Day of November, 2022

Katherine Kelly Vidal
*Director of the United States Patent and Trademark Office*